Dec. 25, 1951 L. E. BARTON 2,579,996
FREQUENCY SELECTIVE SIGNAL AMPLIFYING SYSTEM
Filed July 28, 1949
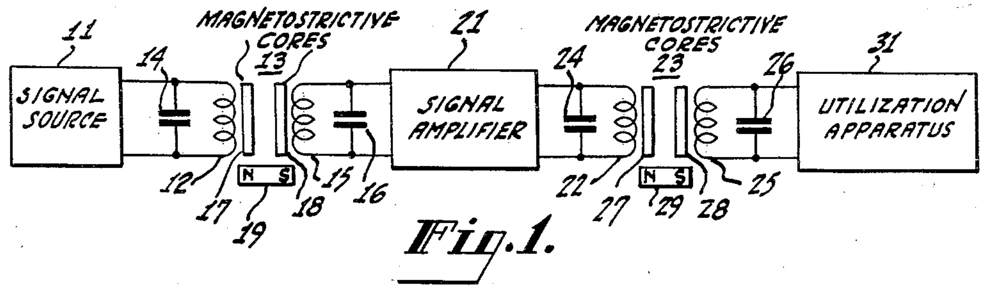
Fig. 1.
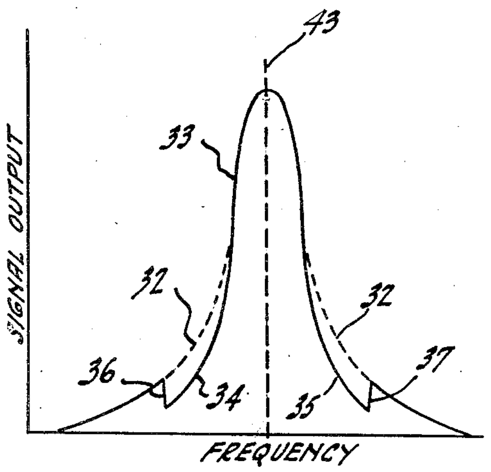
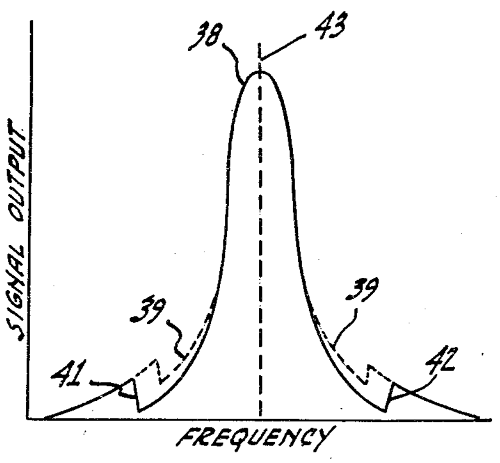
Fig. 2.
Fig. 3.
Inventor
LOY E. BARTON
By H. L. Newton
Attorney Patented Dec. 25, 1951

2,579,996

UNITED STATES PATENT OFFICE 2,579,996

FREQUENCY SELECTIVE SIGNAL AMPLIFYING SYSTEM

Loy E. Barton, Princeton, N. J., assignor to Radio Corporation of America, a corporation of Delaware Application July 28, 1949, Serial No. 107,328

13 Claims. (Cl. 179—171)

This invention relates to interstage coupling transformers for use in signal amplifying systems, and particularly, to transformers of this character for use with frequency selective signal amplifying systems.

Some of the signal amplifying systems for use in radio receivers and the like are employed to amplify the signal-modulated carrier waves before final demodulation thereof for the recovery of the intelligence signals. In such cases, it is necessary to restrict the signal amplification to a particular band of frequencies so that suitable selection may be effected of a desired one of a number of adjacent carrier wave signaling channels.

One such signal amplifying system incorporated in radio receivers operating according to the superheterodyne principle is the so-called intermediate frequency amplifier. The signal-modulated carrier waves which are impressed upon an amplifying system of this character from the output circuit of a frequency converter stage have a predetermined intermediate frequency. Accordingly, such an amplifier is required to effect signal amplification substantially uniformly over a band of frequencies centering about the intermediate frequency. The width of the frequency band to be amplified for maximum fidelity of signal amplification should be substantially equal to the band width of the carrier wave signaling channel. At the same time, the amplifying system should be capable of substantially completely attenuating all frequencies outside of the predetermined band in order to prevent interference from signals modulated on carrier waves having frequencies in adjacent signaling channels.

Accordingly, intermediate frequency signal amplifying systems are provided with resonant circuit facilities designed to render the systems effective for the amplification of the desired signals and, at the same time, to render them ineffective for the amplification of undesired signals in channels adjacent to the selected one. While the tuned circuits of frequency selective amplifying systems of the character described, in most cases, operate satisfactorily, there are numerous instances where, by reason of the fact that the radio receiver is made highly sensitive for the reception of relatively weak signals, relatively strong signals in adjacent channels are not completely rejected by the tuned circuits of the amplifying system so that some interference and consequent signal distortion results. Usually this deficiency of frequency selective amplifying systems is caused by the fact that the resonant circuits do not have a sufficiently sharp cutoff at the limiting frequencies of the band to be amplified.

Accordingly, it is an object of the present invention to provide an improved frequency selective signal amplifying system wherein frequencies in signaling channels adjacent to the channel including the band of frequencies to be amplified are substantially completely attenuated.

Another object of the invention is to provide, in a frequency selective signal amplifying system, an improved interstage coupling transformer having energy absorbing facilities respectively resonant at frequencies immediately outside of the band of frequencies to be amplified.

A further object of the invention is to provide an interstage coupling transformer for use in a frequency selective signal amplifying system wherein electro-mechanical resonating cores are employed to attenuate frequencies outside of the band of frequencies to be amplified.

In accordance with the present invention, there is provided a frequency selective signal amplifying system embodying one or more interstage coupling transformers coupled between a source of signals and a signal amplifying device or utilization apparatus. The transformer comprises inductively coupled primary and secondary windings, each of which may be capacitively tuned for resonance in the band of frequencies to be amplified. Magnetic cores are coupled respectively to the windings and at least one of the cores is of a character to be electro-mechanically resonant at a predetermined frequency so as to absorb, and thereby prevent the transfer between the circuits coupled by the transformer of, energy at the predetermined frequency. In some forms of the invention each of the windings may be provided with an electro-mechanical resonating core, one of which is made resonant at the lower one of two frequencies to be attenuated and the other of which is made resonant at the higher one of the two frequencies to be attenuated. In one particular form of the invention, the resonating cores may be magnetostrictive elements and the transformer may additionally be provided with a magnetic device for suitably polarizing the cores for good magnetostrictive operation. Additionally, the polarizing magnetic means may be used for suitably tuning the respective transformer windings.

The novel features that are considered characteristic of this invention are set forth with particularity in the appended claims. The invention itself, however, both as to its organization and method of operation, as well as additional objects and advantages thereof, will best be understood from the following description taken in connection with the accompanying drawing.

In the drawing,

Figure 1 is a diagrammatic representation of that portion of a frequency selective signal amplifying system embodying the invention;

Figure 2 is a series of curves showing the response characteristic of one stage of the signal amplifying system embodying the invention; and, Figure 3 is a similar series of curve showing the response characteristic of a second stage of the signal amplifying system embodying the invention.

Referring now to Figure 1 of the drawing there is shown a source 11 of a signal-modulated band of carrier waves. For example, the signal source 11 may be the output circuit of a frequency converter stage of a superheterodyne radio receiver. The output circuit of the signal source 11 is coupled to the primary winding 12 of an interstage coupling transformer 13 which, in the case of a superheterodyne radio receiver, may be the first stage intermediate frequency transformer. The winding 12 is resonated by a shunt-connected capacitor 14 for response over a predetermined band of frequencies, the center frequency of which corresponds to the predetermined intermediate frequency. There is coupled inductively to the primary winding 12 a secondary winding 15 which also may be resonated at the intermediate frequency by a shunt-connected capacitor 16. The primary and secondary windings 12 and 15 respectively have associated therewith individual cores 17 and 18. These cores are good electro-mechanical resonators preferably being made of magnetostrictive material, such as certain of the magnetic ferrites. The dimensions of the cores 17 and 18 are such that the primary winding core 17 has a sharp mechanical resonance point at a frequency which is lower than the band of intermediate frequencies, and the secondary winding core 18 has a sharp mechanical resonance point at a frequency which is higher than the band of intermediate frequencies. It also is desirable to provide a magnetic device such as a permanent magnet 19 for suitably polarizing the two cores for good magnetostrictive activity.

The secondary winding 15 is coupled to the input circuit of a signal amplifying stage 21, the output circuit of which is coupled to the primary winding 22 of a second interstage coupling transformer 23, which in general may be substantially similar to the transformer 13 previously described. The primary winding 22 is resonated at the intermediate frequency by a shunt-connected capacitor 24. The transformer 23 also includes a secondary winding 25 for which is provided a shunt-connected resonating capacitor 26. This transformer also includes primary and secondary winding electro-mechanically resonant cores such as the magnetostrictive cores 27 and 28 respectively. In addition, a magnetic polarizing device, such as a permanent magnet 29 is mounted adjacent to the cores 27 and 28. The secondary winding 25 is coupled to suitable utilization apparatus 31 such as another signal amplifying stage or a signal demodulating stage.

The cores 27 and 28 of the transformer 23 may, if desired, be suitably grounded for resonance at the same frequencies that the respective cores 17 and 18 of the transformer 13 are resonant. Alternatively, in accordance with another feature of the invention, the primary winding core 27 of the transformer 23 may be ground for resonance at a frequency which is somewhat lower than the frequency at which the primary winding core 17 of the transformer 13 is resonant. In such a case, it may be desirable that the secondary winding core 28 of the transformer 23 be ground for resonance at a frequency which is somewhat higher than the frequency at which the secondary winding core 18 of the transformer 13 is resonant.

Referring now to the operation of the apparatus embodying the present invention, additional reference will be made to Figures 2 and 3 of the drawing. Figure 2 illustrates the response characteristic of the transformer 13 of Figure 1. The broken line curve 32 together with those connecting portions of the solid line curve 33 represents a typical response characteristic of a conventional frequency selective interstage coupling transformer. It is seen that, in the regions indicated by the broken line portions 32 of the response characteristic curve, there is considerable response by the transformer to frequencies immediately adjacent to the limiting frequencies of the band which it is desired to amplify. However, by the use of the magnetostrictive cores 17 and 18 in accordance with the invention, the two skirts of the curve may be materially modified as indicated by the solid line portions 34 and 35. The sharp attenuation of frequencies outside of the desired pass band which is indicated by the section 36 of the curve 33 is effected by the action of the primary winding core 17 which is resonant at this particular frequency, and accordingly, absorbs substantial energy from the signals impressed upon the primary winding 12 to produce the sharp dip indicated in the curve. Similarly, the section 37 of the curve 33 indicates the sharp attenuation of frequencies immediately higher than the desired band of frequencies produced by the resonance of the secondary winding core 18 of the transformer 13. It, therefore, may be seen that the use of the magnetostrictive cores 17 and 18 in the transformer 13 produces materially sharper cutoff of the tuned circuits of the transformer.

If it is desired to effect a still greater attenuation of these particular adjacent channel frequencies, a second interstage coupling transformer such as the transformer 23 may be provided with magnetostrictive cores ground to resonate at substantially the same frequencies as the cores 17 and 18 of the transformer 13.

However, if it is desired to attenuate other adjacent channel frequencies still farther removed from the band of frequencies to be amplified, the cores 27 and 28 of the transformer 23 may be ground to resonate at slightly different frequencies from those at which the cores 17 and 18 of the transformer 13 resonate. Such an effect is graphically illustrated in Figure 3 of the drawing to which reference now will be made. In the response curve 38, the broken line sections 39 represent the operation of the transformer 13. By grinding the primary winding core 27 of the transformer 23 for resonance at a lower frequency than the frequency at which the primary winding core 17 of the transformer 13 resonates, the sharp attenuation of this lower frequency is represented by the section 41 of the curve 38. Similarly, the section 42 of the curve 38 indicates the sharp attenuation of the higher frequency at which the secondary winding core 28 is ground for resonance. It may be seen, therefore, from an inspection of the curve 38 representing the response characteristic of the transformer 23, that this transformer has a somewhat sharper cutoff than the transformer 13 and a materially sharper cutoff than conventional interstage coupling transformers.

It should be apparent that the improved frequency selective signal amplifying system in accordance with the present invention provides for a relatively high order of adjacent channel frequency rejection with a minimum modification of conventional interstage coupling transformers. In order to more clearly describe the operation of the signal amplifying system embodying the invention without, however, intending to necessarily restrict its field of use, assume that it is to be used in the intermediate frequency signal amplifying stages of a superheterodyne receiver for the reception of signals in the broadcast band of frequencies. In such a case, the center intermediate frequency may be 455 kilocycles, which is indicated by the vertical broken lines 43 of Figures 2 and 3. In the broadcast band adjacent channels are spaced apart by 10 kilocycles. Accordingly, in the transformer 13, the primary winding core should be ground so that it is resonant at a frequency of 445 kilocycles and the secondary winding core 18 should be resonant at a frequency of 465 kilocycles, which may be represented respectively by the portions 36 and 37 of the curve 33 of Figure 2. Also, in the form of the invention embodied in the transformer 23 and described in connection with Figure 3, the primary and secondary winding cores 27 and 28 may be ground for resonance respectively at frequencies such as 440 kilocycles and 470 kilocycles.

Obviously, other frequencies may be chosen by those skilled in the art for accomplishing particularly different results without departing from the scope of the present invention. In one particular case, however, when operating according to the specific frequencies referred to, the transformer cores were made of magnetic ferrite material approximately $\frac{1}{16}''$ square in cross section and approximately $\frac{1}{4}''$ in length. The lengths of the individual cores were ground specifically different in order to effect individual resonance thereof at the desired frequencies. The adjustment in length, however, is one which, it will be understood by those skilled in the art, is comparable to the adjustment of a trimmer capacitor for achieving the exact resonance desired. It was found that, when using cores of the character described and when operating at the particular frequencies referred to, in one transformer an increased attenuation attributable to the operation of the cores of approximately 2 to 1 was obtained. By the use of a second similar transformer having cores resonating at the same frequencies at which the cores of the first transformer resonate, a 4 to 1 increase in attenuation can be obtained. Also, in accordance with the foregoing description of the transformer 23 in conjunction with the curve 38 of Figure 3, it may be seen that a substantially 2 to 1 increase in attenuation may be obtained at substantially any other desired frequencies.

It, therefore, will be apparent to those skilled in the art that the invention may be embodied in various forms other than those specifically disclosed herein for illustrative purposes. Accordingly, the scope of the invention is to be determined particularly by reference to the appended claims.

What is claimed is:

1. An output coupling transformer for a source of signal-modulated carrier waves having a predetermined frequency band, said transformer comprising inductively coupled primary and secondary windings tuned for resonance in said predetermined frequency band, and electro-mechanical resonating cores for said respective windings, said cores being resonant respectively at different frequencies adjacent to and outside of said predetermined band of frequencies.

2. A coupling transformer as defined in claim 1, in which said primary winding core is resonant at a frequency lower than said predetermined frequency band, and said secondary winding core is resonant at a frequency higher than said predetermined frequency band.

3. A coupling transformer as defined in claim 2, in which said predetermined frequency band corresponds to the band width of a selected signaling channel, and wherein said primary winding core is resonant substantially at the center frequency of the next lower adjacent signaling channel, and said secondary winding core is resonant substantially at the center frequency of the next higher adjacent signaling channel.

4. A coupling transformer as defined in claim 3, in which said cores are magnetostrictive elements.

5. A coupling transformer as defined in claim 4, in which said magnetostrictive elements are magnetic ferrite rods, and which includes a magnetic polarizing device for said rods to effect a predetermined degree of magnetostrictive operation thereof.

6. In a multi-stage system for selectively amplifying signal-modulated carrier waves having a predetermined band of frequencies, a plurality of interstage coupling transformers each having inductively coupled primary and secondary windings tuned for resonance in said frequency band, and electro-mechanical resonating cores for said respective transformer windings, said cores being resonant at frequencies adjacent to and outside of said predetermined frequency band.

7. Interstage coupling transformers as defined in claim 6, in which some of said cores are resonant at frequencies lower than said predetermined frequency band, and the others of said cores are resonant at frequencies higher than said predetermined frequency band.

8. Interstage coupling transformers as defined in claim 7, in which said lower frequency cores are coupled to said primary windings, and said higher frequency cores are coupled to said secondary windings.

9. Interstage coupling transformers as defined in claim 8, in which two of said primary winding cores are resonant at two different lower frequencies, and two of said secondary winding cores are resonant at two different higher frequencies.

10. In a multi-stage selective signal amplifying system, a source of signal-modulated carrier waves having a predetermined frequency band, a signal amplifying stage, utilization apparatus for said waves, a first interstage coupling transformer having inductively coupled primary and secondary windings tuned for resonance in said frequency band and coupled respectively to said source and to said amplifying stage, a second interstage coupling transformer having inductively coupled primary and secondary windings tuned for resonance in said frequency band and coupled respectively to said amplifying stage and to said utilization apparatus, and electro-mechanical resonating cores for said respective transformer windings, one core of each of said transformers being resonant at a frequency lower than said frequency band, and the other core of each of said transformers being resonant at a frequency higher than said frequency band.

11. A multi-stage selective signal amplifying system as defined in claim 10, in which said lower frequency cores are coupled to said primary windings and are resonant at two different ones of said lower frequencies, and said higher frequency cores are coupled to said secondary windings and are resonant at two different ones of said higher frequencies.

12. A multi-stage selective signal amplifying system as defined in claim 11, in which said predetermined frequency band is the frequency band of a selected signaling channel, and wherein the primary and secondary winding cores of said first transformer are individually resonant at the center frequencies of the next lower and higher adjacent signaling channels respectively, and the primary and secondary winding cores of said second transformer are individually resonant at frequencies respectively lower and higher than said center frequencies.

13. A multi-stage selective signal amplifying system as defined in claim 10, in which said predetermined frequency band is the frequency band of a selected signaling channel, and wherein said lower frequency cores are coupled to said primary windings and are resonant at the center frequency of the next lower adjacent signaling channel, and said higher frequency cores are coupled to said secondary windings and are resonant at the center frequency of the next higher adjacent signaling channel.

LOY E. BARTON.

REFERENCES CITED

The following references are of record in the file of this patent:

UNITED STATES PATENTS

| Number | Name | Date |
|---|---|---|
| 1,794,847 | Green | Mar. 3, 1931 |
| 2,094,044 | Mason | Sept. 28, 1937 |
| 2,266,658 | Robinson | Dec. 16, 1941 |
| 2,405,999 | Collar et al. | Aug. 20, 1946 |
| 2,435,487 | Adler | Feb. 3, 1948 |